United States Patent
Cai

(10) Patent No.: US 7,999,315 B2
(45) Date of Patent: Aug. 16, 2011

(54) QUASI-RESURF LDMOS

(75) Inventor: Jun Cai, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 238 days.

(21) Appl. No.: 12/395,817

(22) Filed: Mar. 2, 2009

(65) Prior Publication Data

US 2010/0219471 A1   Sep. 2, 2010

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/335; 257/E29.256
(58) Field of Classification Search .................. 257/335, 257/E29.256
See application file for complete search history.

(56) References Cited

U.S. PATENT DOCUMENTS

| | | | |
|---|---|---|---|
| 4,672,738 | A | 6/1987 | Stengl et al. |
| 6,492,679 | B1 | 12/2002 | Imam et al. |
| 6,979,875 | B2 | 12/2005 | Kwon et al. |
| 7,626,233 | B2 | 12/2009 | Tornblad et al. |
| 2005/0139858 | A1 | 6/2005 | Sung |
| 2007/0090451 | A1* | 4/2007 | Lee .............................. 257/327 |
| 2009/0230468 | A1* | 9/2009 | Cai .............................. 257/337 |
| 2009/0253234 | A1* | 10/2009 | Lee .............................. 438/151 |
| 2010/0084686 | A1* | 4/2010 | Cai et al. ....................... 257/192 |
| 2010/0155830 | A1* | 6/2010 | Takahashi ....................... 257/328 |

OTHER PUBLICATIONS

Hower, P.L., et al., "Snapback and Safe Operating Area of Ldmos Transistors", *IEEE*, (1999), 4 pgs.
Pan, Robert, et al., "High Voltage (up to 20V) Devices Implementation in 0.13 um BiCMOS Process Technology for System-On-Chip (SOC) Design", *IEEE, Proceedings of the 18th International Symposium on Power Semiconductor Devices & IC's*, Jun. 4-8, 2006 Naples, Italy, (2006), 4 pgs.
Riccardi, Damiano, et al., "BCD8 from 7V to 70V: a new 0.18um Technology Platform to Address the Evolution of Applications towards Smart Power ICs with High Logic Contents", *IEEE, Proceedings of the 19th International Symposium on Power Semiconductor Devices & ICs*, May 27-30, 2007, Jeju Korea, (2007), pp. 73-76.
Tsai, Chin-Yu, et al., "16-60V Rated LDMOS Show Advanced Performance in an 0.72um Evolution BiCMOS Power Technology", *IEEE*, (1997), pp. 367-370.
Ma, Yutao, et al., "Introduction to Cadence LDMOS Model", Cadence [ppt], (Dec. 2005), 18 pgs.
Pritiskutch, John, et al., "Understanding LDMOS Device Fundamentals", Application Note AN1226, (Jul. 2000), 4 pgs.
Vestling, L., et al., "Drift region optimization of lateral RESURF devices", Solid-State Electronics, 46(8), (Aug. 2002), 1177-1184.

* cited by examiner

*Primary Examiner* — David S Blum
(74) *Attorney, Agent, or Firm* — Schwegman, Lundberg & Woessner, P.A.

(57) ABSTRACT

A semiconductor device can include a drift region, at least a portion of the drift region located laterally between a drain region and a source region. The drift region can include a first layer having a first doping concentration and a second layer having a second higher doping concentration than the first layer. The second layer of the drift region be configured to allow drift current between the source region and the drain region when a depletion region is formed in at least a portion of the first layer between the source region and the drain region.

23 Claims, 10 Drawing Sheets

QUASI-RESURF LDMOS

TECHNICAL FIELD

This document pertains generally to semiconductor devices, and more particularly, but not by way of limitation, to a Quasi-Resurf Lateral Double-Diffused Metal Oxide Semiconductors (LDMOS).

BACKGROUND

A transistor is a semiconductor device used to switch or amplify electronic or electrical signals. Early transistor usage was dominated by Bipolar Junction Transistor (BJT) devices. The BJT is a three terminal transistor constructed of doped semiconductor material, popular due to their ease of manufacture and speed. As demand for high-speed, low-cost, small-size digital components increased, Metal Oxide Field Effect Transistor (MOSFET) devices became more prevalent. The MOSFET typically includes a metal or polysilicon gate separated from a semiconductor region by an insulator. The semiconductor region generally includes a substrate of a first conductivity type, and a source region and drain region of a second different conductivity type located on either side of the semiconductor region, under the insulator. Two different MOSFET devices include an enhancement MOSFET and a normally "on" depletion MOSFET device.

The enhancement MOSFET includes a drain region and a source region isolated by the substrate. In the enhancement MOSFET, as voltage is applied to the gate, a channel forms on the surface of the semiconductor region between the drain and the source, allowing current to flow between the source and the drain.

In contrast, the depletion MOSFET includes a coupled source and drain region extending below the gate. Here, as voltage is applied to the gate, a depletion region forms under the insulator, narrowing the coupled region between the source and the drain, the narrowed region reducing the ability for current to flow between the source and the drain.

Overview

A semiconductor device can include a drift region, at least a portion of the drift region located laterally between a drain region and a source region. The drift region can include a first layer having a first doping concentration and a second layer having a second higher doping concentration than the first layer. The second layer of the drift region be configured to allow drift current between the source region and the drain region when a depletion region is formed in at least a portion of the first layer between the source region and the drain region.

In Example 1, a semiconductor device includes a substrate including a semiconductor region defining a working top surface in which the semiconductor device is formed, a drain region in the semiconductor, a source region in the semiconductor, and a drift region in the semiconductor, the drift region including at least a portion that is located laterally between the drain region and the source region. The drift region includes a first layer, having a first doping concentration of a first conductivity type, and a second layer, extending below an underside of the first layer, the second layer having a second higher doping concentration of the first conductivity type than the first layer and configured to allow drift current between the source region and the drain region in the second layer when a depletion region is formed in at least a portion of the first layer between the source region and the drain region.

In Example 2, the first layer of Example 1 optionally includes a retrograde doping concentration of the first conductivity type.

In Example 3, the second layer of any one or more of Examples 1-2 optionally includes a retrograde doping concentration of the first conductivity type.

In Example 4, the substrate of any one or more of Examples 1-3 optionally is a second conductivity type different than the first conductivity type.

In Example 5, the first conductivity type of any one or more of Examples 1-4 optionally includes n type conductivity.

In Example 6, the doping concentration of the first layer of any one or more of Examples 1-5 optionally includes a higher doping concentration at a location near at least one of the source region or the drain region than at a location that is between the source and the drain region but located further from the source region and the drain region, providing a depletion region in the first layer at the location that is between the source and the drain region but located further from the source region and the drain region.

In Example 7, the semiconductor device of any one or more of Examples 1-6 optionally includes a field oxide region located over at least a portion of the first layer of the drift region, wherein the first layer of the drift region includes a non-uniform thickness, having a relatively thinner first layer portion under a thicker field oxide portion, and having a relatively thicker first layer portion under a thinner field oxide portion.

In Example 8, the thinner first layer portion of any one or more of Examples 1-7 optionally has a lower doping concentration than the thicker first layer portion, providing a depletion region in at least a portion of the thinner first layer portion.

In Example 9, the source region of any one or more of Examples 1-8 optionally includes a first highly doped portion of the first conductivity type, wherein the source region is located in a second conductivity type region having a second different conductivity type than the first conductivity type. The second conductivity type region of any one or more of Examples 1-8 optionally includes a first portion having a third doping concentration of the second conductivity type, the first portion at least partially surrounding the source region, separating the source region and the first layer, and a second portion having a fourth lower doping concentration of the second conductivity type than the first portion, the second portion extending below an underside of the first portion, the second portion extending vertically between the first portion and the second layer of the drift region, and located lateral to the first layer of the drift region.

In Example 10, the first portion of the second conductivity type region of any one or more of Examples 1-9 optionally has a retrograde doping concentration of the second conductivity type, wherein the second conductivity type includes p type conductivity.

In Example 11, the second conductivity type region of any one or more of Examples 1-10 optionally includes a third portion having a fifth higher doping concentration of the second conductivity type than the first portion, the third portion positioned above the first portion and located lateral to the first highly doped portion of the source region and opposite the first layer of the drift region with respect to the first highly doped portion of the source region, the third portion reducing the size of the effective source region.

In Example 12, the third portion of the second conductivity type region of any one or more of Examples 1-11 is optionally located proximate to an oxide spacer formed above the first highly doped portion of the source region.

In Example 13, the third portion of the second conductivity type region of any one or more of Examples 1-12 is optionally self-aligned to an oxide spacer formed above the first highly doped portion of the source region.

In Example 14, the semiconductor device of any one or more of Examples 1-13 optionally includes a first silicide layer positioned above the third portion of the second conductivity region and positioned at least partially laterally to and at least partially above the first highly doped portion of the source region, the first silicide layer connected to both the first highly doped portion of the source region and the third portion of the second conductivity type region.

In Example 15, the drain region of any one or more of Examples 1-14 optionally includes a fourth highly doped portion of the first conductivity type, and a fifth portion of the first conductivity type having a sixth lower doping concentration than the fourth highly doped portion, the fifth portion at least partially surrounding the fourth highly doped portion, at least a portion of the fifth portion extending vertically between the fourth highly doped portion and the second layer of the drift region, and at least a portion of the fifth portion extending laterally between the fourth highly doped portion and the first layer of the drift region.

In Example 16, the fifth portion of the drain region of any one or more of Examples 1-15 optionally has a retrograde doping concentration of the first conductivity type, wherein the first conductivity type includes n type conductivity.

In Example 17, the semiconductor device of any one or more of Examples 1-16 optionally includes a second silicide layer positioned above the fourth highly doped portion of the drain region, the second silicide layer connected to the drain region.

In Example 18, a depth of the first layer of the drift region of any one or more of Examples 1-17 is optionally substantially similar to a depth of the second portion of the second conductivity type region and to a depth of the fifth portion of the drain region.

In Example 19, the drift region of any one or more of Examples 1-18 optionally includes a third layer, contacting at least a portion of the second layer of the drift region, the third layer having a seventh higher doping concentration of the first conductivity type than the second layer.

In Example 20, the second higher doping concentration of the second layer of the drift region of any one or more of Examples 1-19 is optionally selected to provide a desired depletion region depth to avoid punchthrough from the drain region to the source region, or to target a desired breakdown voltage.

In Example 21, a semiconductor device includes a substrate including a semiconductor region defining a working top surface in which the semiconductor device is formed, a drain region in the semiconductor, a source region in the semiconductor, the source region including a first highly doped portion of a first conductivity type, a drift region in the semiconductor, the drift region including at least a portion that is located laterally between the drain region and the source region. The drift region includes a first layer, having a first doping concentration of the first conductivity type, and a second layer, extending below an underside of the first layer, the second layer having a second higher doping concentration of the first conductivity type than the first layer and configured to allow drift current between the source region and the drain region in the second layer when a depletion region is formed in at least a portion of the first layer between the source region and the drain region, wherein the second higher doping concentration of the second layer is selected to provide a desired depletion region depth to avoid punchthrough from the drain region to the source region, or to target a desired breakdown voltage. The semiconductor device includes a field oxide region located over at least a portion of the first layer of the drift region, wherein the source region is located in a second conductivity type region having a second different conductivity type than the first conductivity type. The second conductivity type region includes a first portion having a third doping concentration of the second conductivity type, the first portion at least partially surrounding the source region, separating the source region and the first layer, a second portion having a fourth lower doping concentration of the second conductivity type than the first portion, the second portion extending below an underside of the first portion, the second portion extending vertically between the first portion and the second layer of the drift region, and located lateral to the first layer of the drift region, and a third portion having a fifth higher doping concentration of the second conductivity type than the first portion, the third portion positioned above the first portion and located lateral to the first highly doped portion of the source region and opposite the first layer of the drift region with respect to the first highly doped portion of the source region, the third portion reducing the size of the effective source region. The first layer of the drift region includes a non-uniform thickness, having a relatively thinner first layer portion under a thicker field oxide portion, and having a relatively thicker first layer portion under a thinner field oxide portion, and the thinner first layer portion has a lower doping concentration than the thicker first layer portion, providing a depletion region in at least a portion of the thinner first layer portion. The drain region includes a fourth highly doped portion of the first conductivity type, and a fifth portion of the first conductivity type having a lower doping concentration than the fourth highly doped portion, the fifth portion at least partially surrounding the fourth highly doped portion, at least a portion of the fifth portion extending vertically between the fourth highly doped portion and the second layer of the drift region, and at least a portion of the fifth portion extending laterally between the fourth highly doped portion and the first layer of the drift region. The semiconductor device includes a first silicide layer positioned above the third portion of the second conductivity region and positioned at least partially laterally to and at least partially above the first highly doped portion of the source region, the first silicide layer connected to both the first highly doped portion of the source region and the third portion of the second conductivity type region, and a second silicide layer positioned above the fourth highly doped portion of the drain region, the second silicide layer connected to the drain region. Further, a depth of the first layer of the drift region is substantially similar to a depth of the second portion of the second conductivity type region and to a depth of the fifth portion of the drain region.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventor has recognized, among other things, that a Lateral Double-Diffused Metal Oxide Semiconductors (LDMOS) drift region can be constructed having two or more layers, including a first layer having a first doping concentration of a first conductivity type, and a second layer below the first layer having a second higher doping concentration of the first conductivity type than the first layer. In an example, the first layer can include a relatively low doping concentration of the first conductivity type, and, in certain examples, can be depleted at off-state for a reduced surface electric field (Quasi-RESURF). The second layer can include the second higher doping concentration of the first conductivity type, which, in certain examples, can provide a low resistance path for on-state drift current flowing between a drain and a source of the LDMOS device. A multiple voltage rated self-aligned (e.g., fully self-aligned) LDMOS device can be integrated into an advanced Complimentary Metal-Oxide-Semiconductor (CMOS) platform.

Figure 1:
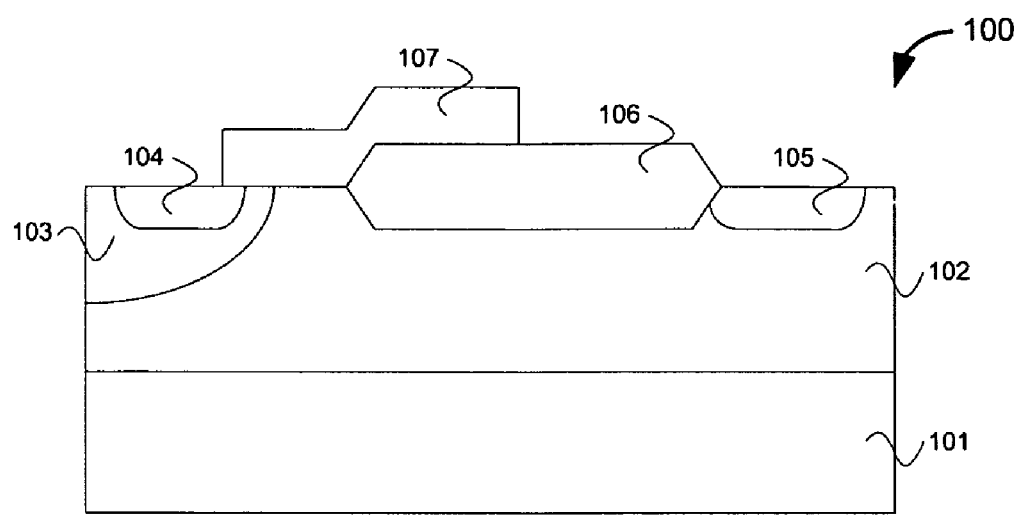
FIG. 1 illustrates generally a prior art example of a structure of a Field Plate Lateral Double-Diffused Metal Oxide Semiconductor (LDMOS) device.

FIG. 1 illustrates generally a prior art example of a structure of a Field Plate Lateral Double-Diffused Metal Oxide Semiconductor (LDMOS) device 100, including a first region 101 having a second conductivity type (e.g., a p-type substrate or epitaxial layer (p/p+epi)), a second region 102 having a first conductivity type (e.g., an n-type well (n well)), a third region 103 having the second conductivity type (e.g., a p-type body (p body)), a source region 104 having the first conductivity type (e.g., n-type source (n+ source)), a drain region 105 having the second conductivity type (e.g., n-type drain (n+ drain)), a field oxide layer 106, and a gate region 107.

The Field Plate LDMOS device 100 of FIG. 1 includes several limitations. For example, the Field Plate LDMOS device 100 can require a p body diffusion process, a high dose or large angle p body implant, or one or more electron megavolt (MeV) p body implant. A strong stopping power metal can be required to block boron penetrating gate oxide at high implant energies. Further, a reduced surface electric field (RESURF) drift region is formed before the field oxide process.

In certain examples, a self-aligned p-body of LDMOS device cannot be diffused very deep due to a limited thermal budget of an advanced CMOS platform. In an example, the advanced CMOS gate poly may not be thick enough to block reasonable high energy p body implant. Therefore, a high energy p body implant can make the LDMOS device lose the self-aligned flavor, and also lead to boron penetration of a thin gate oxide.

However, if the p body junction is not deep enough due to a relatively low implant energy, the channel of the device can become short (e.g., inducing premature punchthrough) and the parasitic npn beta of the LDMOS device can become high. Although a short channel of the device can benefit high speed operation for high efficiency, the channel premature punchthrough and high parasitic npn beta can make the device less robust with a smaller safe operating area (SOA).

RESURF in a drift region of an LDMOS device illustrates one approach to trade-off LDMOS breakdown voltage and drain to source on-resistance ($R_{DS(on)}$). A novel RESURF design can be needed for a multiple voltage rated LDMOS device integrated into an advanced CMOS platform with limited thermal budget and limited substrate, epitaxy, or epitaxial layer thickness without sacrificing advanced CMOS platform features (e.g., low substrate minority carrier lifetime due to increased advanced CMOS latch-up sensitivity in a small dimension process code, etc.).

For these and other reasons, the present inventor has recognized, among other things, an LDMOS semiconductor device including a drift region constructed having two or more layers, including a first layer having a first doping concentration of a first conductivity type, and a second layer below the first layer having a second higher doping concentration of the first conductivity type than the first layer.

Figure 2:
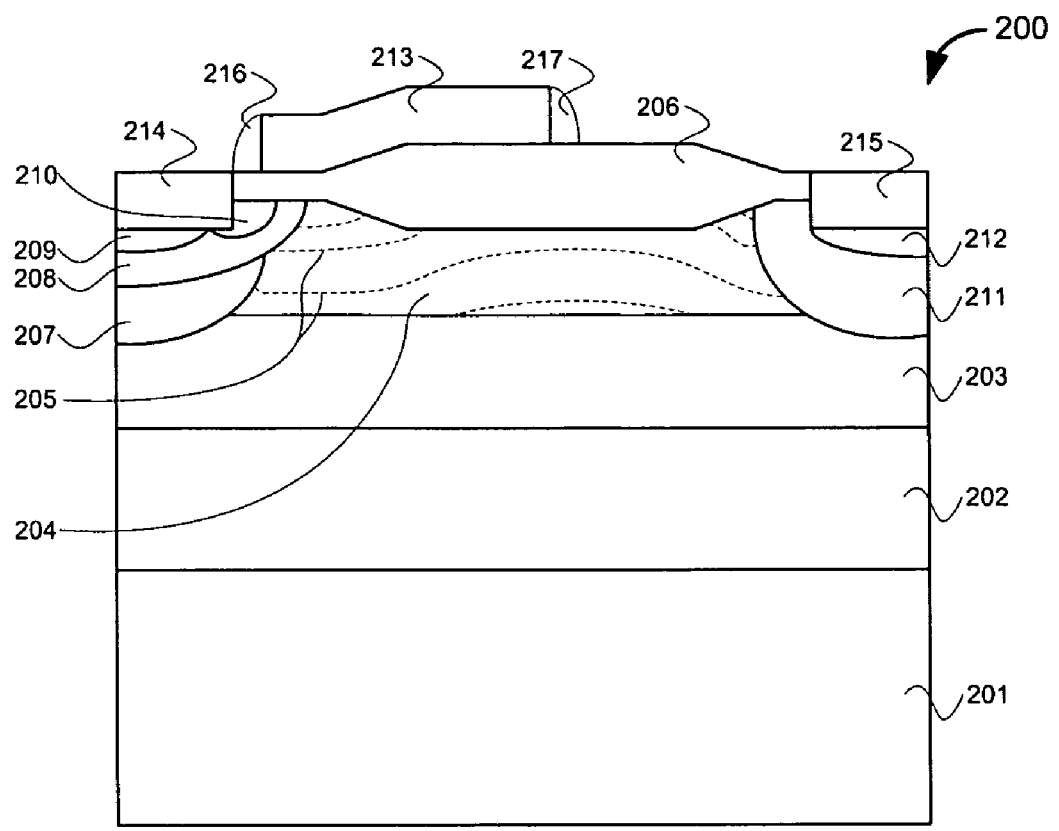
FIG. 2 illustrates generally an example of a Quasi-RESURF LDMOS device.

FIG. 2 illustrates generally an example of a Quasi-RESURF LDMOS device 200 including a source region having a first silicide layer 214 and a first highly doped portion 210 of a first conductivity type, a drain region having a second silicide layer 215 and a fourth highly doped portion 212 of the first conductivity type, a gate region having a polysilicon gate 213, a field oxide region 206, and a drift region including a first layer 204 and a second layer 203.

In an example, the Quasi-RESURF LDMOS device 200 can include a first region 201 including a first wafer or substrate (e.g., a W or WO p+ substrate), and a second region 202 including an epitaxial or other layer (e.g., a p-epi or p substrate) over the first region 201. In other examples, one or more of the first region 201 or the second region 202 can be omitted, or the Quasi-RESURF LDMOS device 200 can include one or more other substrate or starting material. In an example, one or more of the first region 201 or the second region 202 can include a second different conductivity type (e.g., p-type) than the first conductivity type (e.g., n-type).

In the example of FIG. 2, at least a portion of the drift region is located laterally between the drain region and the source region. In an example, the first layer 204 can include a first doping concentration (e.g., a low doping concentration) of a first conductivity type (e.g., n-type), the first layer 204 being located between the source and drain regions and below the field oxide region 206. In an example, the first layer 204 can include a quasi-depletion region (QDR) (e.g., a shallow low doping QDR). The second layer 203, extending below an underside of the first layer 204, can include a second higher doping concentration of the first conductivity type than the first layer 204. In an example, the second layer 203 can include a retrograde-doping buried well (RBW) (e.g., a very deep RBW).

In other examples, one or more of the first layer 204 or the second layer 203 can include a retrograde doping concentration of the first conductivity type. In an example, the second higher doping concentration of the second layer 203 of the drift region can be selected to provide a desired depletion region depth, for example, to avoid punchthrough from the drain region to the source region, or to target a desired breakdown voltage.

In certain examples, the first lower doping concentration of the first layer 204, in contrast to the second higher doping concentration of the second layer 203, can be configured to form a depletion region (e.g., at off-state) in at least a portion of the first layer 204 between the source region and the drain region. In certain examples, the depletion region can provide a reduced surface electric field, or Quasi-RESURF. In an example, the depletion region can include at least a portion of a vertical cross-section of at least a portion of the first layer 204. In other examples, the depletion region can include an entire vertical cross-section of at least a portion of the first layer 204, from below the field oxide region 206 to the second layer 203, or the depletion region can extend into at least a portion of the second layer 203. In an example, a shallow first layer 204 can prevent short channel lateral premature punch-through.

In other examples, the second higher doping concentration of the second layer 203, in contrast to the first lower doping concentration of the first layer 204, can be configured to allow drift current (e.g., at on-state) in at least a portion of the second layer 203 between the source region and the drain region. In an example, the second layer 203 can provide a low resistance path for on-state drift current flowing in a sub-surface between the source and drain regions (e.g., a low drain to source on-resistance ($R_{Ds(on)}$)).

In an example, the first layer 204 can be formed self-aligned to the field oxide region 206 with a non-uniform doping profile, having a very low doping concentration below the field oxide region 206, and a higher doping concentration closer to the source and drain regions, or other regions surrounding the source and drain regions. In certain examples, doping profile lines 205 can illustrate generally one example of the non-uniform doping profile of the first layer 204, such as a lower doping concentration in the first layer 204 under the center of the field oxide region 206 (e.g., between the source region and the drain region) than under the sides of the field oxide region 206 (e.g., proximate the source region or the drain region). In certain examples, the doping concentration in the first layer 204 directly proximate the source and drain regions can be a relatively high doping concentration (e.g., compared to the doping concentration under the center of the field oxide region 206).

In an example, the field oxide region 206 can be located over at least a portion of the first layer 204 of the drift region. In this example, the field oxide region 206 and the first layer 204 can have non-uniform thicknesses. In an example, the first layer 204 can include a relatively thinner portion under a relatively thicker portion of the field oxide 206 (e.g., the center of the first layer 204 and the field oxide 206, respectively), and the first layer 204 can include a relatively thicker portion under a relatively thinner portion of the field oxide 206 (e.g., the first layer proximate the source region). In an example, the thinner first layer portion can have a lower doping concentration than the thicker first layer portion. In other examples, the field oxide region 206 can include, or be replaced by, a semiconductor shallow trench isolation (STI) oxide.

In an example, the source region can include the first highly doped portion 210 (e.g., n+ source) of the first conductivity type (e.g., n-type) and the first silicide layer 214 (e.g., source contact, or other metal-Si or other alloy). In an example, the first highly doped portion 210 can be located in, or can be at least partially surrounded by, a second conductivity type region having the second different conductivity type (e.g., p-type) than the first conductivity type (e.g., n-type). In certain examples, the second conductivity type region can be configured to separate at least a portion of the source region (e.g., at least a portion of one or more of the first highly doped portion 210 or the first silicide layer 214) from at least a portion of the drift region (e.g., at least a portion of one or more of the first layer 204 or the second layer 203).

In an example, the second conductivity type region can include a first portion 208 (e.g., p body) having a third doping concentration of the second conductivity type. In an example, the first portion 208 can have a retrograde doping concentration. In an example, the first portion 208 can at least partially surround, encompass, or contact at least a portion of the source region (e.g., the first highly doped portion 210 of the first conductivity type), separating at least a portion of the source region from at least a portion of the drift region (e.g., at least a portion of the first layer 204 of the drift region).

In an example, the second conductivity type region can include a second portion 207 (e.g., p well) having a fourth lower doping concentration of the second conductivity type than the first portion 208. In an example, the second portion 207 can extend below an underside of, or at least partially surround, encompass, or contact at least a portion of the first portion 208. In an example, the second portion 207 can extend vertically between the first portion 208 and the second layer 203 of the drift region, and can be located lateral to the first layer 204 of the drift region.

In an example, the second conductivity type region can include a third portion 209 (e.g., p+ tap) having a fifth high doping concentration of the second conductivity type than the first portion 208. In an example, the third portion 209 can be positioned above the first portion 208 and located lateral to the first highly doped portion 210 of the source region. In an example, the third portion 209 can be positioned opposite the first layer 204 of the drift region with respect to the first highly doped portion 210 of the source region. In an example, the third portion 209, having the higher fifth doping concentration, can reduce the size of the effective source region.

In certain examples, the second conductivity type region can be included in, or can be considered to be a portion of the source region. In an example, the source region can be considered a short channel (SC) device, having a n+ source spacer and step p body. The short channel can be compatible with fine process code for high frequency and high efficiency. The step p body can be formed by a self-aligned shallow p body and p well (e.g., the first portion 208 and the second portion 207 of the second conductivity type region). In an example, the first highly doped portion 210 of the source region (e.g., n+ source, or shallow n+ source) can be formed only below an oxide spacer (e.g., formed proximate the poly-silicon gate 213 above the source region). The source architecture described herein can make a high voltage LDMOS minimum source pitch close to or equal to a low voltage NMOS minimum source pitch for high density packing capability, and can reduce the overall p body resistance for a reduced parasitic npn beta (even though the channel of the device is short).

In an example, the first silicide layer 214 can be positioned above the third portion 209 of the second conductivity region. The first silicide layer 214 can be positioned at least partially laterally to and at least partially above the first highly doped portion 210 of the source region. In an example, the first silicide layer 214 can be in physical contact to both the first highly doped portion 210 of the source region and the third portion 209 of the second conductivity region. Further, the first silicide layer 214 can be located proximate to or self aligned to an oxide spacer (e.g., a first oxide spacer 216).

In an example, the drain region can include the fourth highly doped portion 212 (e.g., n+ drain) of the first conductivity type and the second silicide layer 215 (e.g., drain contact, or other metal-Si or other alloy). In an example, the drain region can include a fifth portion 211 (e.g., n well) of the first conductivity type having a sixth lower doping concentration than the fourth highly doped portion 212. In an example, the fifth portion 211 can at least partially surround the fourth highly doped portion 212. In certain examples, at least a portion of the fifth portion 211 can extend vertically between the fourth highly doped portion 212 of the drain region and the second layer 203 of the drift region. In an example, at least a portion of the fifth portion 211 can extend laterally between the fourth highly doped portion 212 of the drain region and the first layer 204 of the drift region. In an example, the fifth portion 211 of the drain region can have a retrograde doping concentration of the first conductivity type (e.g., n type). In certain examples, the gradual drain (e.g., the fourth highly doped portion 212, the fifth portion 211, and the second layer 203 on the drain side) vertically contacting the second layer 203 (e.g., RBW) can support low resistance for drain current flowing from the fourth highly doped portion 212 (e.g., n+ drain) to the second layer 203 (e.g., RBW). However, the main device current flows through the second layer 203 (e.g., RBW), away from the surface of the device, making the device robust.

In an example, the second silicide layer 215 can be posited above the fourth highly doped portion 212 of the drain region. In certain examples, the second silicide layer 215 can be in physical contact to the fourth highly doped portion 212 of the drain region. Further, the second silicide layer 215 can be located proximate to or self-aligned with the field oxide 206.

In certain examples, the depth of the first layer 203 of the drift region can be substantially similar to a depth of at least one of the second portion 207 of the second conductivity type region or the fifth portion 211 of the drain region. The thickness or depth of the first layer 203 can be compatible to n well or p well junction depths of an advanced CMOS platform. In other examples, depending on the desired depletion region depth, the first layer 203 of the drift region can be deeper to or shallower than the depth of at least one of the second portion 207 of the second conductivity type region or the fifth portion 211 of the drain region.

Further, the example of FIG. 2 includes a first oxide spacer 216 and a second oxide spacer 217 surrounding the polysilicon gate 213 of the gate region. In an example, the polysilicon gate 213 can be located above the field oxide 206, and can be positioned closer to the source region than the drain region.

In an example, the third portion 209 of the second conductivity type region can be self-aligned to the first oxide spacer 216 or proximate or very close to the first oxide spacer 216 (e.g., for making a small sized or shallow n+ source or n+source spacer).

Figure 3:
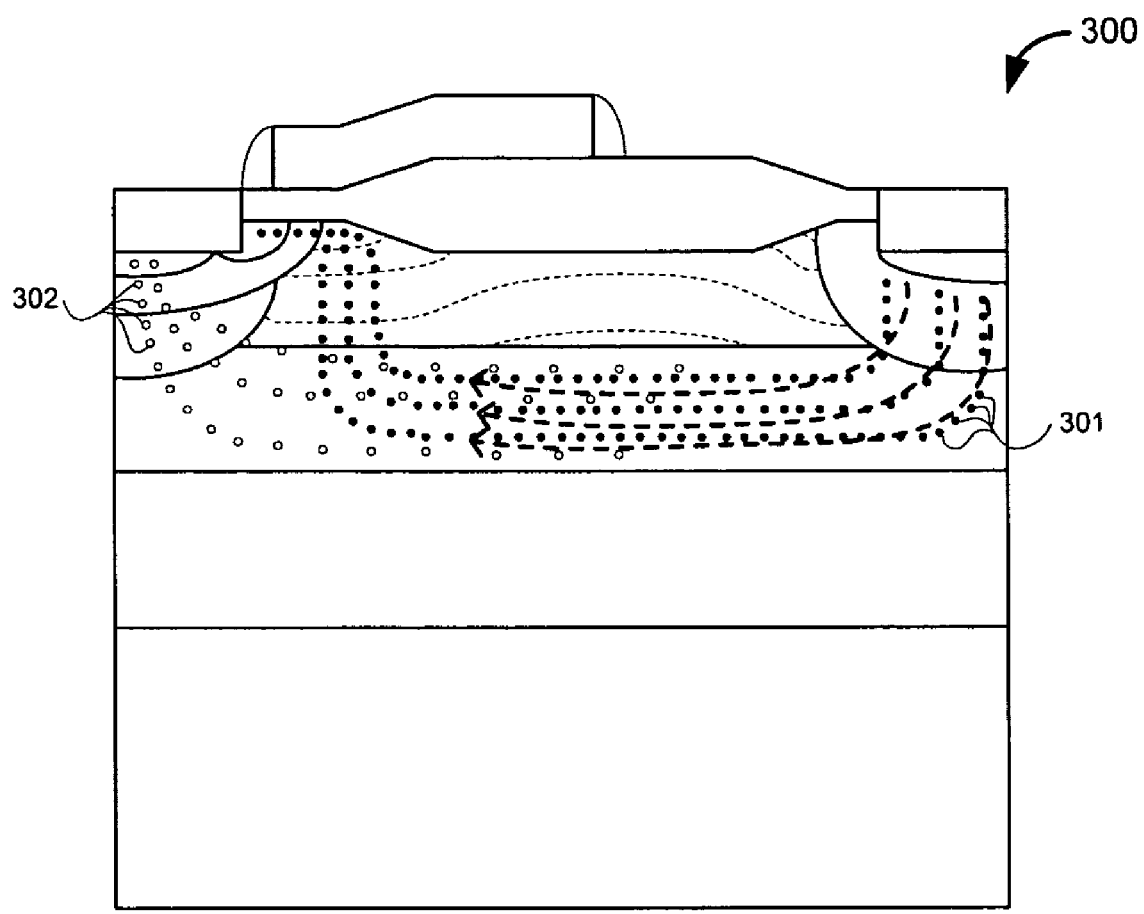
FIG. 3 illustrates generally an example of electron and hole movement in a Quasi-RESURF LDMOS device.

FIG. 3 illustrates generally an example of electron 301 and hole 302 movement (e.g., electron or hole current) in a Quasi-RESURF LDMOS device 300.

On-State Examples

In an example, at on-state and at a high drain voltage, the first layer of the drift region (e.g., QDR, the first layer 204, etc.) can be partially depleted under a polysilicon field plate or other conductive element of the gate or other region to block drift current flowing laterally in a surface of the Quasi-RESURF LDMOS device 300. A gradual drain doping profile can support a low resistance path for drain current flowing at least partially vertically to the second layer of the drift region (e.g., RBW, the second layer 203, etc.). As a gate voltage increases, more electrons can be allowed into a channel of the Quasi-RESURF LDMOS device 300.

Further, recombination in the second layer of the drift region (e.g., RBW, the second layer 203, etc.) between holes generated from avalanche current and electrons can be localized underneath the gate or source regions. The second conductivity type region (e.g., a stepped p-body region) can effectively collect holes at least partially vertically from the second layer of the drift region to the third portion of the second conductivity type region (e.g., p+ tap, the third portion 209, etc.). In an example, this collection can reduce holes localized under the first highly doped portion of the source region (e.g., n+ source, the first highly doped portion 210, etc.), effectively preventing parasitic npn turn-on for the device SOA.

In the example of FIG. 3, drain current can flow (e.g., easily flow) from a drain region (e.g., an n+ drain contact, the fourth highly doped portion 212 of the drain region, etc.) to a second layer of the drift region (e.g., RBW, the second layer 203, etc.) through a well (e.g., n well, the fifth portion 211, etc.), and hole current in the second layer of the drift region can be collected through a second conductivity type well of the source region (e.g., p well, the second portion 207, etc.) to a highly doped second conductivity type tap (e.g., p+, the third portion 209, etc.). A vertical thinking in both the source and drain regions (e.g., and surrounding areas, such as the second conductivity type region, etc.) with sub-surface (e.g., RBW, etc.) drift current flow can make the device robust with a large SOA.

Off-State Examples

In an example, at off-state (e.g., as the gate is off, or as little to no voltage is applied to the gate region), the first layer of the drift region (e.g., QDR, the first layer 204, etc.) can be fully depleted (e.g., at high drain voltage) to move the electric field peak region away from the surface of the device for an enhanced RESURF.

Figure 4:
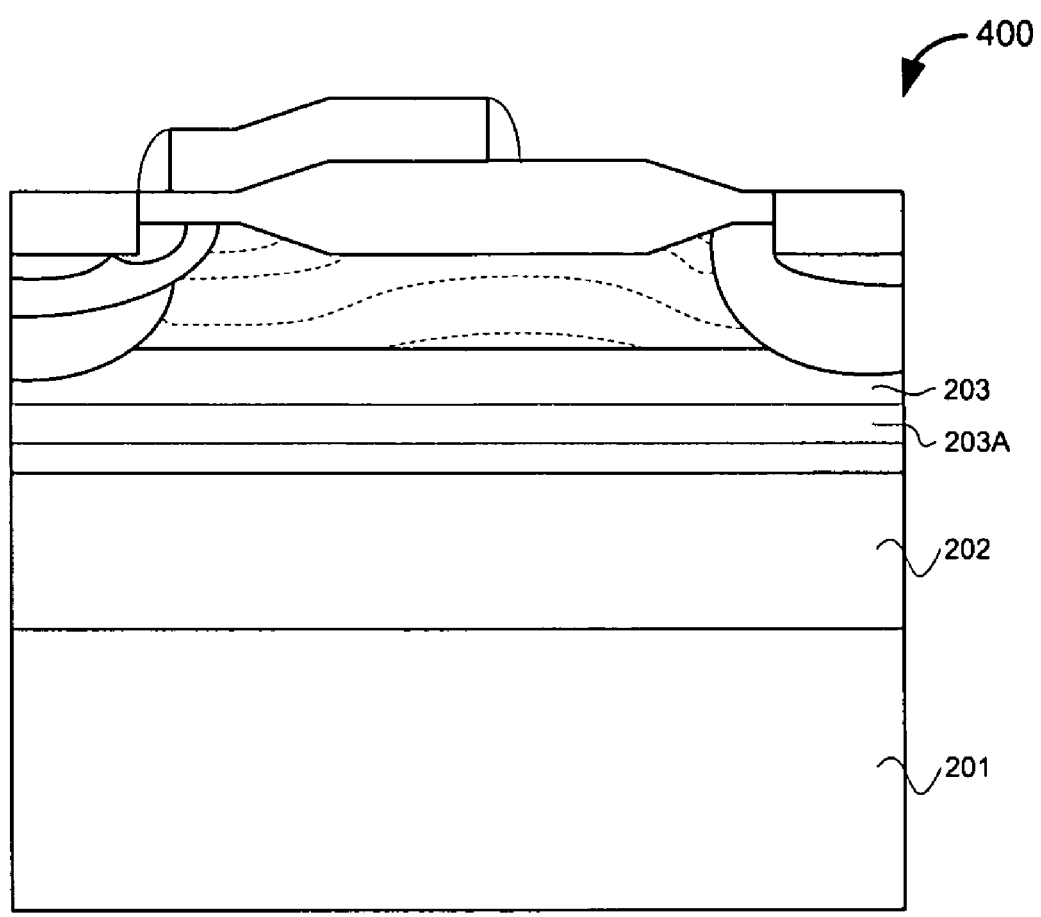
FIG. 4 illustrates generally an example of a Quasi-RESURF LDMOS device including a drift region having first and second layers, and a third layer contacting at least a portion of the second layer.

FIG. 4 illustrates generally an example of a Quasi-RESURF LDMOS device 400 including a first region 201 (e.g., a first wafer or substrate), a second region 202 (e.g., an epitaxial or other layer) over the first region 201, a second layer 203 of a drift region over the second region 202, and a third layer 203A of the drift region contacting at least a portion of the second layer 203 of the drift region.

In an example, the drift region can include a third layer 203A having a seventh higher doping concentration of the first conductivity type than the second layer 203 of the drift region. In an example, the third layer 203A can contact at least a portion of the second layer 203 of the drift region (e.g., located above the second layer 203, below the second layer 203, or located in at least a portion of the second layer 203 having a portion of the second layer 203 above the third layer 203A and a portion of the second layer 203 below the third layer 203A).

Process Examples

FIG. 5A-FIG. 13 illustrate generally examples of process steps for forming a Quasi-RESURF LDMOS device.

Figure 5A:
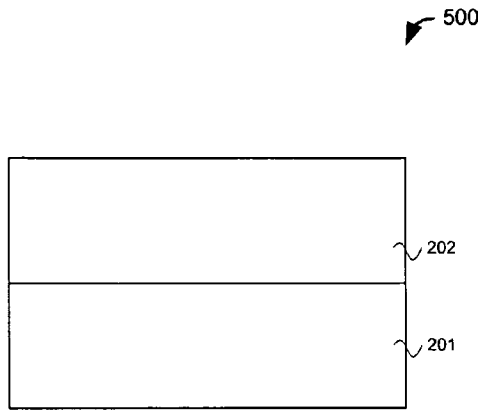
FIG. 5A-FIG. 13 illustrate generally examples of process steps for forming a Quasi-RESURF LDMOS device.
Figure 5B:
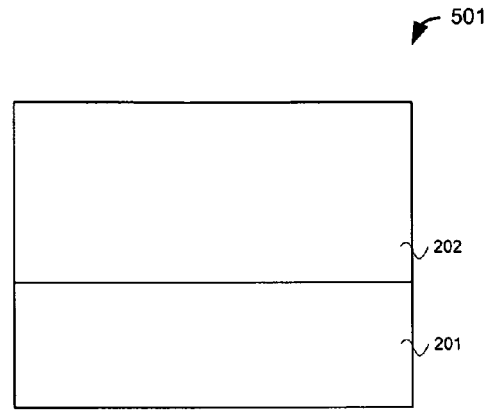

FIGS. 5A-5B illustrate generally examples 500 and 501 of starting material for a Quasi-RESURF LDMOS device including a first region 201 including a first wafer or substrate (e.g., a W or WO p+ substrate), and a second region 202 including an epitaxial or other layer (e.g., a p-epi or p substrate) over the first region 201. In example 500, the second region 202 can include a first thickness. In example 501, the second region 202 can include a second thickness, thicker than the first thickness of example 500.

Figure 6A:
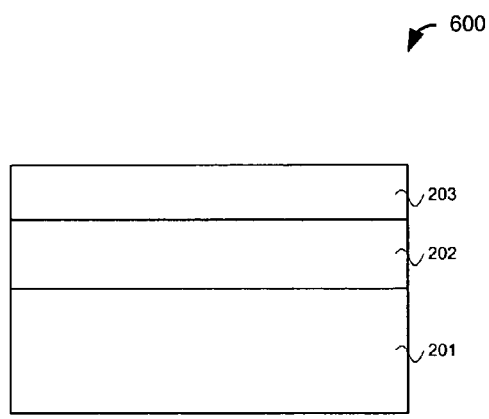
Figure 6B:
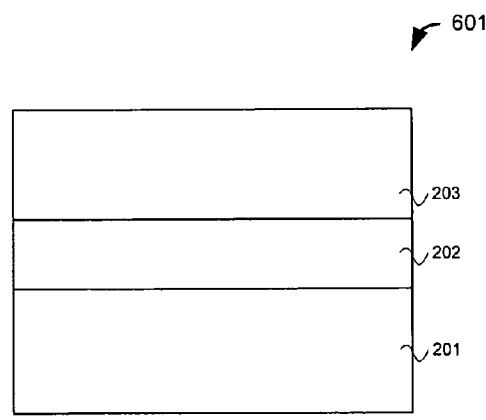

FIGS. 6A-6B illustrate generally examples 600 and 601 of a second layer 203 of a drift region. In an example, the second layer 203 can include an RBW (e.g., a deep RBW) layer. In certain examples, the second layer 203 can be formed using a single or multiple implants to form a retrograde doping profile. In an example, the second region 202 of examples 600 and 601 can have similar thicknesses. In certain examples, the second layer 203 of example 600 can include a first thickness, and the second layer 203 of example 601 can include a second thickness, thicker than the first thickness of example 600.

Figure 7A:
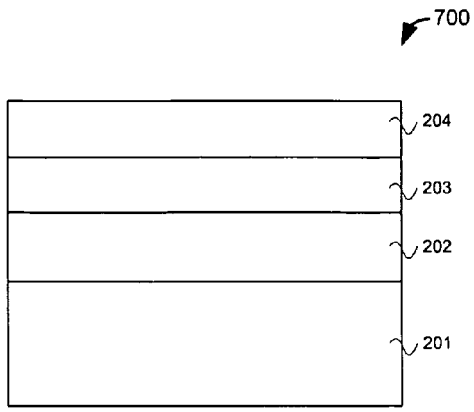
Figure 7B:
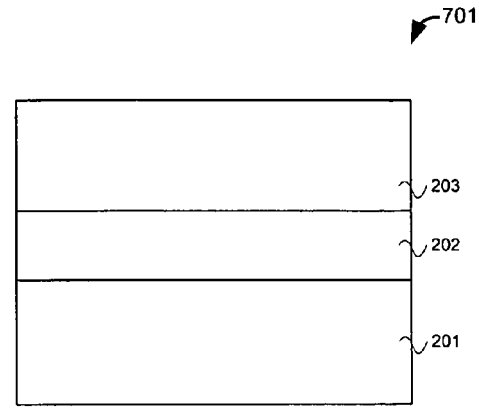

FIG. 7A illustrates generally an example 700 of forming or growing a first layer 204 of the drift region (e.g., an in-line p-epitaxy or epitaxial layer). FIG. 7B illustrates generally an example 701 without forming or growing the first layer 204 of the drift region. Example 701 illustrates a deeper second layer 203 of the drift region, in certain examples, with a lower surface doping concentration.

Figure 8A:
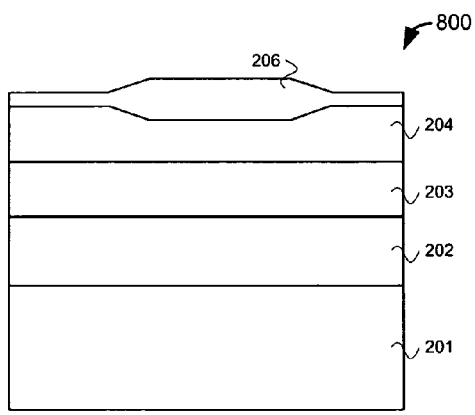
Figure 8B:
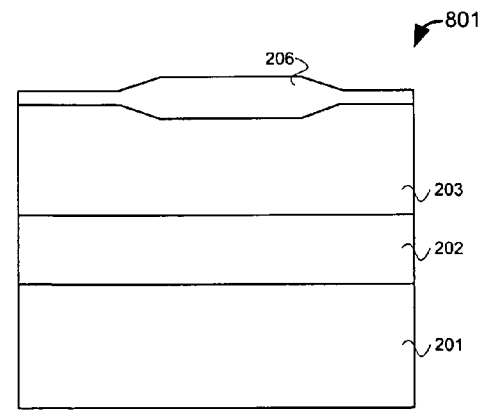

FIGS. 8A-8B illustrate generally examples 800 and 801 of forming a field oxide region 206 (or shallow trench isolation (STI) formation) on the first layer 204, in example 800, and on the second layer 203, in example 801.

Figure 9A:
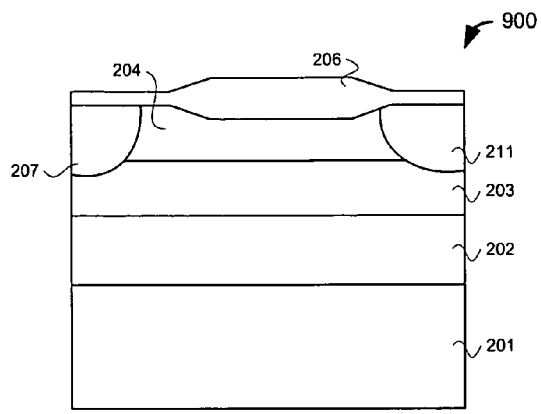
Figure 9B:
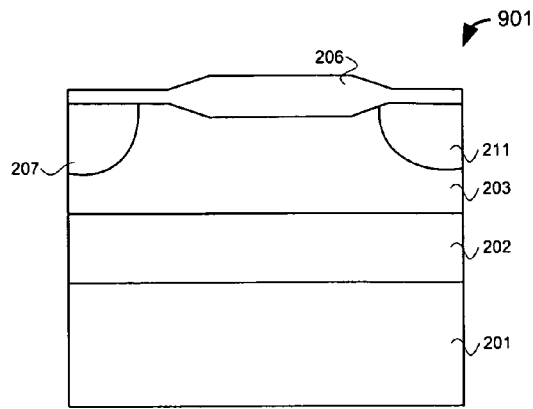

FIGS. 9A-9B illustrate generally examples 900 and 901 of forming a second portion 207 of a second conductivity type region (or a source region) (e.g., p well) and a fifth portion 211 of a drain region (e.g., n well). In certain examples, the second portion 207 and the fifth portion 211 can include retrograde doping profiles.

Figure 10:
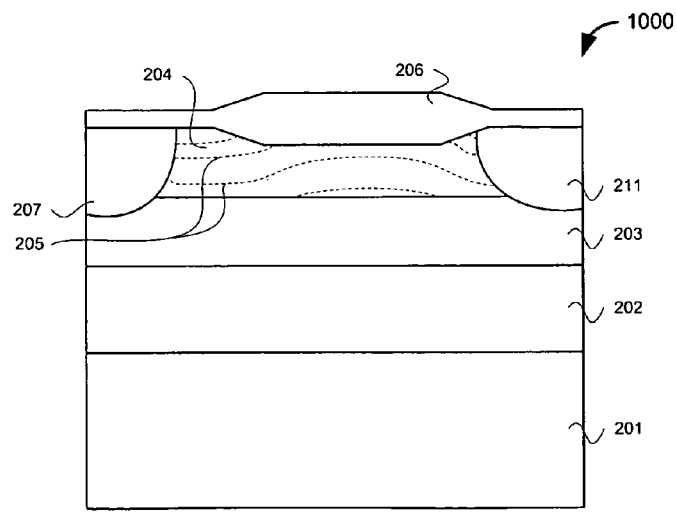

FIG. 10 illustrates generally an example 1000 of forming the first layer 204 of the drift region using multiple implants having different implant energies having shallow implant blocked by a field oxide region 206. In an example, the non-uniform doping concentration in the first layer 204 can be illustrated using doping profile lines 205.

In an example, the second layer 203 of the drift region can be a modular layer with single or multiple implants, adjusting implant energy and dose to trim a thickness of the first layer 204 for a beneficial or best trade-off between drain to source on-resistance ($R_{Ds(on)}$) and breakdown voltage (e.g., drain breakdown voltage with the gate grounded (BVdss)), allowing multiple voltage rated LDMOS devices to be built on the same advanced power analog technology platform.

In an example, after formation of the field oxide region 206, one mask for multiple drift phosphorus implants (different implant energies at different implant doses) can be used to form non-uniform doping profiles in the first layer 204 of the drift region (e.g., QDR). In certain examples, only high energy low dose implants can penetrate through the field oxide region 206 to form a QDR underneath, which can be depleted (e.g., easily depleted) at a high drain voltage. In an example, a relative high doping concentration (e.g., being the sum of multiple implants) can be located at a JFET region (e.g., proximate the source or second conductivity type region including the QDR layer) to reduce pinch-off resistance in the area. The relative high doping concentration can also be located at a drain n well region (e.g., the fifth portion 211) contributing low resistance for current vertically from the drain region (e.g., the fifth portion 211) to the RBW layer (e.g., the second layer 203). In an example, a heavily doped n+ buried layer (NBL) can be implanted inside the RBW layer (e.g., the second layer 203) for reduced parasitic pnp concerns.

Figure 11:
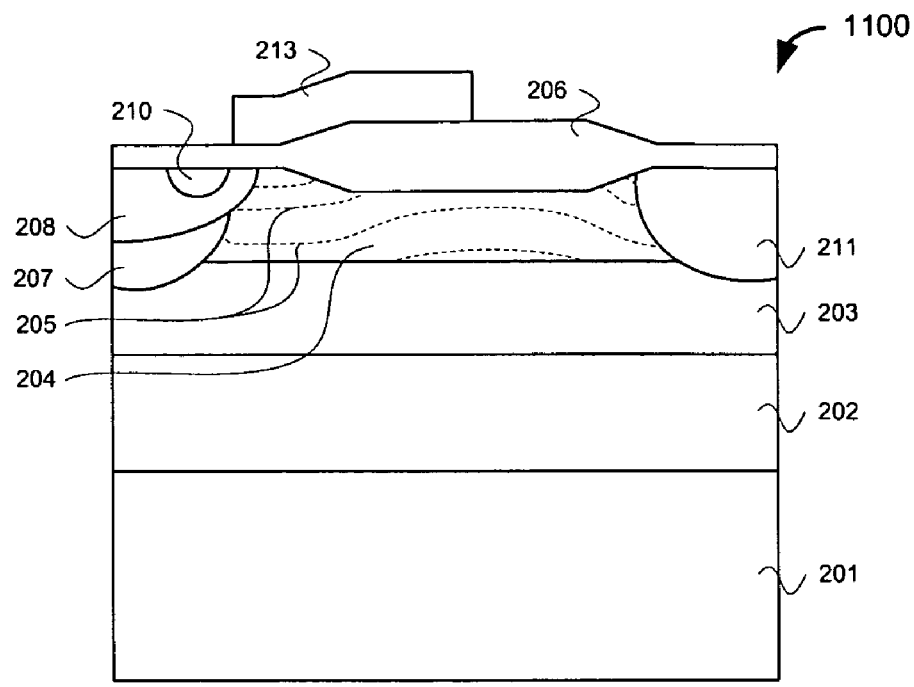

FIG. 11 illustrates generally an example 1100 of forming a polysilicon gate 213 (e.g., gate oxide and gate polysilicon processes) followed by a first highly doped portion 210 (e.g., n+ source) and a first portion 208 (e.g., p body) dual implants.

Figure 12:
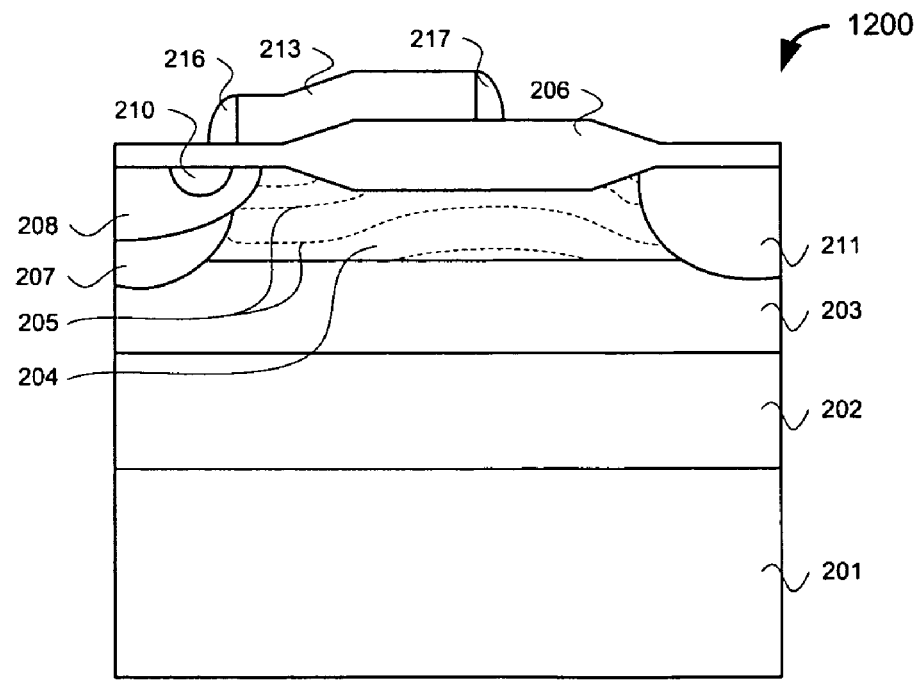

FIG. 12 illustrates generally an example 1200 of forming a first gate oxide spacer 216 and a second gate oxide spacer 217 on either side of the polysilicon gate 213.

Figure 13:
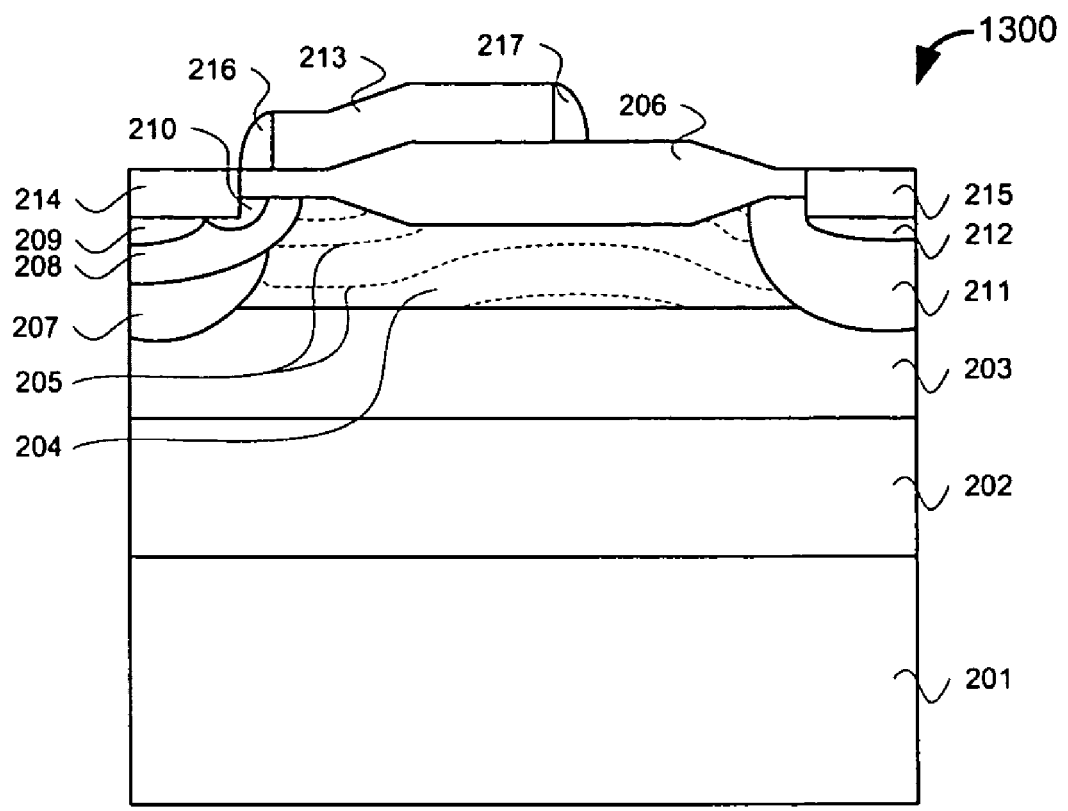

FIG. 13 illustrates generally an example 1300 of a fourth highly doped portion 212 (e.g., n+ drain) and a third portion 209 (e.g., p+ tap) contact implants, and forming a first suicide layer 214 and a second silicide layer 215. In an example, the third portion 209 implant can be self-aligned (or very close to) the first oxide spacer 216 for making a small size and shallow first highly doped portion 210 (e.g., n+ source, or n+ source spacer).

In Example 1, a method of forming a semiconductor device includes providing a substrate including a semiconductor region defining a working top surface in which the semiconductor device is formed, forming a drift region in the semiconductor device, including forming a first layer, having a first doping concentration of a first conductivity type, and forming a second layer, extending below an underside of the first layer, the second layer having a second higher doping concentration of the first conductivity type than the first layer. The method further includes forming a drain region and a source region in the semiconductor device, each located lateral to at least a portion of the drift region. In Example 1, the second layer of the drift region is configured to allow drift current between the source region and the drain region in the second layer when a depletion region is formed in at least a portion of the first layer between the source region and the drain region.

In Example 2, the method of Example 1 optionally includes forming a field oxide layer over the drift region.

In Example 3, the forming the source region and drain region of any one or more of Examples 1-2 optionally includes forming a retrograde n-type or p-type well formation after forming the field oxide layer.

In Example 3, the method of any one or more of Examples 1-2 optionally includes forming a trench in the first drift region layer.

In Example 4, the method of any one or more of Examples 1-3 optionally includes providing a single or multiple implants with driving to form the second layer with a retrograde doping profile.

In Example 5, the method of any one or more of Examples 1-4 optionally includes providing multiple implants with different implant energies to form the first layer.

In Example 6, the method of any one or more of Examples 1-5 optionally includes forming a first layer of the drift region having a non-uniform doping profile, where shallow implant is blocked by a field oxide region.

In Example 7, the method of any one or more of Examples 1-6 optionally includes forming gate oxide and gate polysilicon over at least a portion of the field oxide layer.

In Example 8, the method of any one or more of Examples 1-7 optionally includes implanting an n+ source and p body region in the formed p well.

In Example 9, the method of any one or more of Examples 1-8 optionally includes forming a first gate oxide spacer and a second gate oxide spacer on a first and second side lateral to the formed gate polysilicon.

In Example 10, the method of any one or more of Examples 1-9 optionally includes forming an n+ drain and a p+ tap in the n well and in the p body, followed by silicidation formation over at least a portion of the source region and at least a portion of the drain region.

Example Doping Concentrations

In certain examples, one or more of the regions, layers, or other features of a Quasi-RESURF LDMOS device (e.g., the Quasi-RESURF LDMOS device 200) can include one or more of the following doping concentrations:

(1) W or WO p+ substrate (e.g., the first region 201): 1e18-5e19 cm$^{-3}$.

(2) P-epi or p substrate (e.g., the second region 202): 1e14-7e15 cm$^{-3}$.

(3) Retrograde-buried well (RBW) (e.g., the second layer 203 of the drift region): 1e16-1e19 cm$^{-3}$.

(4) Quasi-depletion region (QDR) (e.g., the first layer 204 of the drift region): 3e15-3e17 cm$^{-3}$.

(5) N+ source (e.g., the first highly doped portion 210 of the source region): 1e19-5e20 cm$^{-3}$.

(6) P+ tap (e.g., the third portion 209 of the second conductivity type region): 1e19-5e20 cm$^{-3}$.

(7) P body (e.g., the first portion 208 of the second conductivity type region): 8e16-1e18 cm$^{-3}$.

(8) P well (e.g., the second portion 207 of the second conductivity type region): 3e16-9e17 cm$^{-3}$.

(9) N+ drain (e.g., the fourth highly doped portion 212 of the drain region): 1e19-5e20 cm$^{-3}$.

(10) N well (e.g., the fifth portion 211 of the drain region): 3e16-9e17 cm$^{-3}$.

In other examples, one or more other doping concentration values or ranges can be used for one or more of the regions or layers of the Quasi-RESURF LDMOS device.

Sample Data

Figure 14:
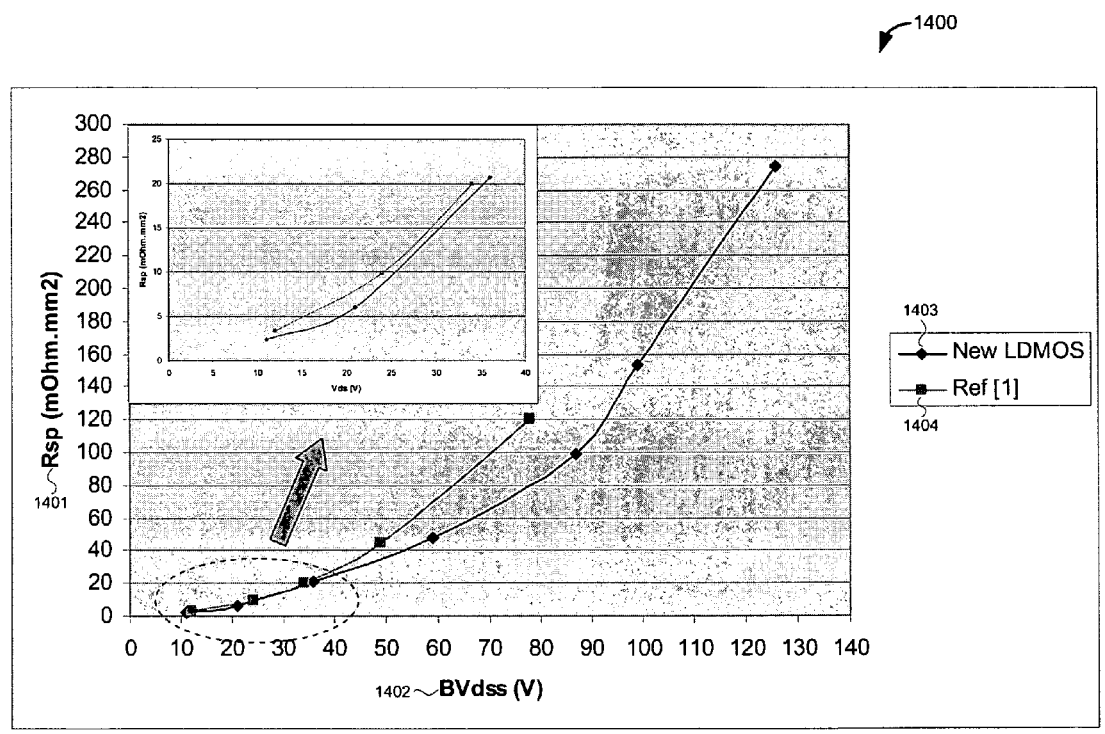
FIG. 14 illustrates generally an example of a relationship between $R_{DS(on)}$ and BVdss for a Quasi-RESURF LDMOS device and a reference LDMOS device.

FIG. 14 illustrates generally an example of a relationship 1400 between drain to source on-resistance ($R_{DS(on)}$) 1401 and breakdown voltage (e.g., drain breakdown voltage with the gate grounded (BVdss)) 1402 for the Quasi-RESURF LDMOS device 1403 disclosed herein and a reference LDMOS device 1404. In this example, the reference LDMOS device 1404 includes a low $R_{DS(on)}$ STMicroelectronics LDMOS device, shown in Damiano Riccardi, et al., *BCD8 from 7V to 70V: a new 0.18 um Technology Platform to Address the Evolution of Applications towards Smart Power ICs with High Logic Contents*, IEEE, Proceedings of the 19th International Symposium on Power Semiconductor Devices & ICs, 73-76 (2007). The relationship 1400 illustrates that the Quasi-RESURF LDMOS device 1403 disclosed herein has a lower $R_{DS(on)}$ 1401 than the reference LDMOS device 1404 across the entire range of BVdss 1402.

Some Notes

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, although the invention has been described relating to nmos devices, it is equally applicable to pmos devices. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A semiconductor device, comprising:
    a substrate including a semiconductor region defining a working top surface in which the semiconductor device is formed;
    a drain region in the semiconductor;
    a source region in the semiconductor; and
    a drift region in the semiconductor device, the drift region including at least a portion that is located laterally between the drain region and the source region, the drift region including:
        a first layer, having a first doping concentration of a first conductivity type, wherein the first layer includes a retrograde doping concentration of the first conductivity type; and
        a second layer, extending below an underside of the first layer, the second layer having a second higher doping concentration of the first conductivity type than the first layer and configured to allow drift current between the source region and the drain region in the second layer when a depletion region is formed in at least a portion of the first layer between the source region and the drain region.

2. The semiconductor device of claim 1, wherein the second layer includes a retrograde doping concentration of the first conductivity type.

3. The semiconductor device of claim 1, wherein the substrate is a second conductivity type different than the first conductivity type.

4. The semiconductor device of claim 1, wherein the first conductivity type includes n type conductivity.

5. The semiconductor device of claim 1, wherein the doping concentration of the first layer includes a higher doping concentration at a location near at least one of the source region or the drain region than at a location that is between the source and the drain region but located further from the source region and the drain region, providing a depletion region in the first layer at the location that is between the source and the drain region but located further from the source region and the drain region.

6. The semiconductor device of claim 1, including:
a field oxide region located over at least a portion of the first layer of the drift region;
wherein the first layer of the drift region includes a non-uniform thickness, having a relatively thinner first layer portion under a thicker field oxide portion, and having a relatively thicker first layer portion under a thinner field oxide portion.

7. The semiconductor device of claim 6, wherein the thinner first layer portion has a lower doping concentration than the thicker first layer portion, providing a depletion region in at least a portion of the thinner first layer portion.

8. The semiconductor device of claim 1, wherein the source region includes a first highly doped portion of the first conductivity type; and
wherein the source region is located in a second conductivity type region having a second different conductivity type than the first conductivity type, the second conductivity type region including:
a first portion having a third doping concentration of the second conductivity type, the first portion at least partially surrounding the source region, separating the source region and the first layer; and
a second portion having a fourth lower doping concentration of the second conductivity type than the first portion, the second portion extending below an underside of the first portion, the second portion extending vertically between the first portion and the second layer of the drift region, and located lateral to the first layer of the drift region.

9. The semiconductor device of claim 8, wherein the first portion of the second conductivity type region has a retrograde doping concentration of the second conductivity type, wherein the second conductivity type includes p type conductivity.

10. The semiconductor device of claim 8, wherein the second conductivity type region includes a third portion having a fifth higher doping concentration of the second conductivity type than the first portion, the third portion positioned above the first portion and located lateral to the first highly doped portion of the source region and opposite the first layer of the drift region with respect to the first highly doped portion of the source region, the third portion reducing the size of the effective source region.

11. The semiconductor device of claim 10, wherein the third portion of the second conductivity type region is located proximate to an oxide spacer formed above the first highly doped portion of the source region.

12. The semiconductor device of claim 10, wherein the third portion of the second conductivity type region is self-aligned to an oxide spacer formed above the first highly doped portion of the source region.

13. The semiconductor device of claim 10, including a first silicide layer positioned above the third portion of the second conductivity region and positioned at least partially laterally to and at least partially above the first highly doped portion of the source region, the first silicide layer connected to both the first highly doped portion of the source region and the third portion of the second conductivity type region.

14. The semiconductor device of claim 10, wherein the drain region includes:
a fourth highly doped portion of the first conductivity type; and
a fifth portion of the first conductivity type having a sixth lower doping concentration than the fourth highly doped portion, the fifth portion at least partially surrounding the fourth highly doped portion, at least a portion of the fifth portion extending vertically between the fourth highly doped portion and the second layer of the drift region, and at least a portion of the fifth portion extending laterally between the fourth highly doped portion and the first layer of the drift region.

15. The semiconductor device of claim 14, wherein the fifth portion of the drain region has a retrograde doping concentration of the first conductivity type, wherein the first conductivity type includes n type conductivity.

16. The semiconductor device of claim 14, including a second silicide layer positioned above the fourth highly doped portion of the drain region, the second silicide layer connected to the drain region.

17. The semiconductor device of claim 14, wherein a depth of the first layer of the drift region is substantially similar to a depth of the second portion of the second conductivity type region and to a depth of the fifth portion of the drain region.

18. The semiconductor device of claim 1, wherein the drift region includes a third layer, contacting at least a portion of the second layer of the drift region, the third layer having a seventh higher doping concentration of the first conductivity type than the second layer.

19. The semiconductor device of claim 1, wherein the second higher doping concentration of the second layer of the drift region is selected to provide a desired depletion region depth to avoid punchthrough from the drain region to the source region, or to target a desired breakdown voltage.

20. A semiconductor device, comprising:
a substrate including a semiconductor region defining a working top surface in which the semiconductor device is formed;
a drain region in the semiconductor;
a source region in the semiconductor, the source region including a first highly doped portion of a first conductivity type;
a drift region in the semiconductor device, the drift region including at least a portion that is located laterally between the drain region and the source region, the drift region including:
a first layer, having a first doping concentration of the first conductivity type; and
a second layer, extending below an underside of the first layer, the second layer having a second higher doping concentration of the first conductivity type than the first layer and configured to allow drift current between the source region and the drain region in the second layer when a depletion region is formed in at least a portion of the first layer between the source region and the drain region, wherein the second higher doping concentration of the second layer is selected to provide a desired depletion region depth to avoid punchthrough from the drain region to the source region, or to target a desired breakdown voltage;
a field oxide region located over at least a portion of the first layer of the drift region;
wherein the source region is located in a second conductivity type region having a second different conductivity type than the first conductivity type, the second conductivity type region including:

a first portion having a third doping concentration of the second conductivity type, the first portion at least partially surrounding the source region, separating the source region and the first layer;

a second portion having a fourth lower doping concentration of the second conductivity type than the first portion, the second portion extending below an underside of the first portion, the second portion extending vertically between the first portion and the second layer of the drift region, and located lateral to the first layer of the drift region; and a third portion having a fifth higher doping concentration of the second conductivity type than the first portion, the third portion positioned above the first portion and located lateral to the first highly doped portion of the source region and opposite the first layer of the drift region with respect to the first highly doped portion of the source region, the third portion reducing the size of the effective source region;

wherein the first layer of the drift region includes a non-uniform thickness, having a relatively thinner first layer portion under a thicker field oxide portion, and having a relatively thicker first layer portion under a thinner field oxide portion;

wherein the thinner first layer portion has a lower doping concentration than the thicker first layer portion, providing a depletion region in at least a portion of the thinner first layer portion;

wherein the drain region includes:
 a fourth highly doped portion of the first conductivity type; and
 a fifth portion of the first conductivity type having a lower doping concentration than the fourth highly doped portion, the fifth portion at least partially surrounding the fourth highly doped portion, at least a portion of the fifth portion extending vertically between the fourth highly doped portion and the second layer of the drift region, and at least a portion of the fifth portion extending laterally between the fourth highly doped portion and the first layer of the drift region;

wherein the semiconductor device includes:
 a first silicide layer positioned above the third portion of the second conductivity region and positioned at least partially laterally to and at least partially above the first highly doped portion of the source region, the first silicide layer connected to both the first highly doped portion of the source region and the third portion of the second conductivity type region; and
 a second silicide layer positioned above the fourth highly doped portion of the drain region, the second silicide layer connected to the drain region; and wherein a depth of the first layer of the drift region is substantially similar to a depth of the second portion of the second conductivity type region and to a depth of the fifth portion of the drain region.

21. A semiconductor device, comprising:
a substrate including a semiconductor region defining a working top surface in which the semiconductor device is formed;
a drain region in the semiconductor;
a source region in the semiconductor;
a drift region in the semiconductor device, the drift region including at least a portion that is located laterally between the drain region and the source region, the drift region including:
 a first layer, having a first doping concentration of a first conductivity type; and
 a second layer, extending below an underside of the first layer, the second layer having a second higher doping concentration of the first conductivity type than the first layer and configured to allow drift current between the source region and the drain region in the second layer when a depletion region is formed in at least a portion of the first layer between the source region and the drain region;
a field oxide region located over at least a portion of the first layer of the drift region; and
wherein the first layer of the drift region includes a non-uniform thickness, having a relatively thinner first layer portion under a thicker field oxide portion, and having a relatively thicker first layer portion under a thinner field oxide portion.

22. The semiconductor device of claim 21, wherein the thinner first layer portion has a lower doping concentration than the thicker first layer portion, providing a depletion region in at least a portion of the thinner first layer portion.

23. A semiconductor device, comprising:
a substrate including a semiconductor region defining a working top surface in which the semiconductor device is formed;
a drain region in the semiconductor;
a source region in the semiconductor; and
a drift region in the semiconductor device, the drift region including at least a portion that is located laterally between the drain region and the source region, the drift region including:
 a first layer, having a first doping concentration of a first conductivity type;
 a second layer, extending below an underside of the first layer, the second layer having a second higher doping concentration of the first conductivity type than the first layer and configured to allow drift current between the source region and the drain region in the second layer when a depletion region is formed in at least a portion of the first layer between the source region and the drain region; and
 a third layer, contacting at least a portion of the second layer of the drift region, the third layer having a seventh higher doping concentration of the first conductivity type than the second layer.

* * * * *